United States Patent [19]

Irwin et al.

[11] 3,875,533

[45] Apr. 1, 1975

[54] CRYSTAL CONTROLLED OVERTONE OSCILLATOR HAVING A REJECTION CIRCUIT FOR PREVENTING OSCILLATION AT UNDESIRED OVERTONES

[75] Inventors: James S. Irwin, Ft. Lauderdale; Francis R. Steel, Pompano Beach, both of Fla.

[73] Assignee: Motorola, Inc., Chicago, Ill.

[22] Filed: Oct. 15, 1973

[21] Appl. No.: 406,530

[52] U.S. Cl. .................... 331/116 R, 331/158

[51] Int. Cl. .................... H03b 5/36

[58] Field of Search .................... 331/116, 158, 164

[56] References Cited

UNITED STATES PATENTS

| | | | |
|---|---|---|---|
| 2,706,783 | 4/1955 | Hensel | 331/164 |
| 2,925,561 | 2/1960 | Macdonald | 331/158 |
| 3,041,550 | 6/1962 | Goncharoff | 331/164 |
| 3,382,462 | 5/1968 | Davis | 331/116 |

*Primary Examiner*—John Kominski

*Attorney, Agent, or Firm*—Eugene A. Parsons; Vincent J. Rauner

[57] ABSTRACT

A crystal controlled overtone oscillator having a feedback circuit comprising a series connected inductance-capacitance arm having the values of the inductance and capacitance chosen to provide a net inductive reactance at the desired overtone and a net capacitive reactance at lower overtones, and a shunt inductance-capacitance arm that is resonant at the desired overtone. A broadband neutralization network is employed to neutralize the static shunt capacitance of the crystal and to provide the shunt inductance-capacitance arm.

8 Claims, 2 Drawing Figures

CRYSTAL CONTROLLED OVERTONE OSCILLATOR HAVING A REJECTION CIRCUIT FOR PREVENTING OSCILLATION AT UNDESIRED OVERTONES

BACKGROUND FIELD OF INVENTION

This invention relates generally to oscillators, and more particularly to crystal controlled overtone oscillator circuits having means for assuring that the oscillator operates at the desired overtone.

PRIOR ART

Several techniques for assuring that an oscillator operates on the desired overtone are known. These techniques include the use of additional inductors and capacitors to reject undesired oscillations, and the use of broadband neutralizing circuits to reduce the spurious oscillations caused by the static shunt capacitance of the crystal. One such neutralizing scheme is described in U.S. Pat. No. 3,731,230 issued May 1, 1973 to Frank J. Cerny, Jr. and assigned to Motorola, Inc.

Whereas these techniques reduce the tendency for an oscillator to operate at undesired frequencies, the first technique requires the use of additional components which must be carefully tuned, and neutralization techniques such as the one described in the Cerny U.S. Pat. No. 3,731,230 do not completely eliminate the possibility of ocillation at overtones that are lower than the desired operating frequency.

SUMMARY

It is an object of the present invention to provide an oscillator circuit that will operate at only the desired overtone.

It is another object of the invention to provide a crystal controlled overtone oscillator using a minimal number of parts.

In accordance with a preferred embodiment of the invention, a crystal controlled overtone oscillator having a Colpitts configuration utilizes a transformer to neutralize the shunt capacitance of the crystal. The inductance of the neutralizing transformer is chosen to provide a parallel resonant circuit between one plate of the crystal and the common or ground potential at the operating overtone. A series connected inductance-capacitance network having values chosen to provide a net inductive reactance at the operating frequency and a net capacitive reactance at lower overtones is included in the feedback loop to prevent oscillation at the lower overtones.

DETAILED DESCRIPTION

Figure 1:
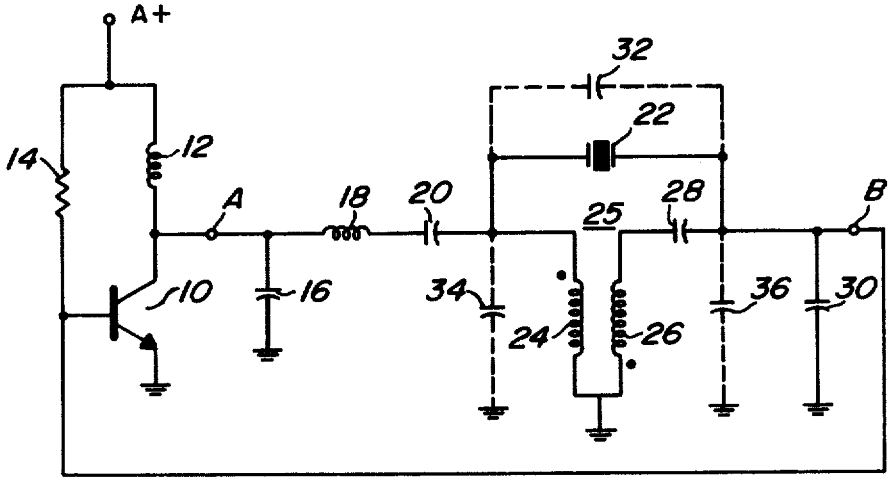
FIG. 1 is a circuit diagram of a preferred embodiment of the invention utilizing a neutralizing transformer.

Referring to FIG. 1, a transistor 10 has a collector connected to the power suppply A+ through an isolating impedance such as a resistor or an RF choke 12, and an emitter connected to ground or common potential. A base of the transistor 10 is connected to the power supply A+ through a resistor 14 which provides bias current for the transistor 10. The collector of the transistor 10 is connected to a capacitor 16 which has one terminal thereof connected to ground and to one terminal of an inductor 18. In alternate embodiments, any electrode of the transistor 10 may be grounded provided that appropriate changes are made in the grounding of other circuit components. The other terminal of the inductor 18 is connected to one terminal of a capacitor 20 which has the other terminal thereof connected to one terminal of a crystal 22 and the primary winding 24 of a neutralizing transformer 25. The crystal 22 is an overtone type crystal which is resonant at a fundamental frequency and at overtones of the fundamental frequency. Another terminal of the crystal 22 is connected to a secondary winding 26 of the transformer 25 through a capacitor 28. The junction of the crystal 22 and the capacitor 28 is connected to a capacitor 30 and the base of the transistor 10. The capacitor 30 is connected to ground as are the windings 24 and 26 of the transformer 25.

A capacitor 32, shown in dashed lines, is connected in shunt with the crystal 22 and represents the static shunt capacitance of the crystal. The capacitors 34 and 36, shown in dashed lines connected in shunt with the windings 24 and 26, respectively, represent an equivalent capacitance in shunt with the windings 24 and 26 which results from the neutralization of the capacitor 32.

The operation of the circuit of FIg. 1 is similar to that of a Colpitts oscillator, the inductor 18, the capacitors 16, 20 and 30, and the crystal 22 providing a 180° phase shift between the collector and base of the transistor 10 at the desired overtone. At the desired overtone or operating frequency such as, for example, the third overtone,, the impedance of the crystal 22 is substantially resistive, and the net reactance of the inductor 18 and capacitor 20 is substantially inductive. The inductive reactance of the combination of inductor 18 and capacitor 20, and the capacitive reactances of the capacitors 16 and 30 provide the necessary 180° phase shift.

The neutralizing transformer 25 neutralizes the shunt capacitance 32, as described in the Cerny U.S. Pat. No. 3,731,230 by providing a negative feedback path around the crystal 22 for substantially cancelling the current flowing through the capacitor 32. The neutralization process results in the capacitances 34 and 36, each having a capacitance value of twice that of the capacitor 32, in shunt with the windings 24 and 26, respectively.

The capacitances 34 and 36 have been considered as undesirable in prior art circuits, and coils have been added to tune out the effects thereof. However, in the circuit of FIG. 1, the capacitances 34 and 36 serve a useful function. By selecting the inductance of the winding 24 such that the combination of the winding 24 and capacitor 34 is parallel resonant at the desired overtone, the possibility of oscillations at resonant frequencies of the crystal other than the desired overtone is reduced. At frequencies below the desired operating frequency, the resonant circuit comprising winding 24 and capacitor 34 will be inductive, thereby altering the phase shift of the feedback network to prevent oscillation. At frequencies above the desired oscillating frequency, the combination of capacitance 34 and winding 24 will be capacitive to increase the attenuation of the feedback network to aid in preventing oscillation.

The capacitance 36 is in parallel with the capacitor 30, thereby forming a part of the feedback network and making the elimination of the effects of the capacitor 36 unnecessary. In certain high frequency oscillators, the value of the capacitance 36 may be sufficient to provide the necessary 180° phase shift, and the capacitor may be eliminated.

In a Colpitts oscillator, the series arm of the feedback loop must be inductive to maintain oscillation, and in Colpitts oscillators of the prior art, the series arm remains inductive at all frequencies, thereby making it possible for the oscillator to oscillate at overtones that are lower than the desired operating frequency. In the circuit of FIG. 1, the series arm of the feedback circuit includes the inductor 18 and the capactor 20. The inductance of the inductor 18 and the capacitance of the capacitor 20 is chosen such that the inductive reactance of the inductor 18 is larger than the capacitive reactance of the capacitor 20 at the desired operating frequency, thereby making the net reactance of the combination of the inductor 18 and capacitor 20 inductive. The values are further chosen such that the value of the net inductive reactance of the combination of the inductor 18 and the capacitor 20 is approximately equal to the sum of the capacitive reactance of the capacitor 16 and the capacitive reactance of the capacitance 34 at the operating frequency. The aforementioned conditions are listed in equation for below. At the desired operating frequency:

$X_{34} = X_{24}$ $X_{18} - X_{20} = X_{16} + X_{34}$, and $X_{18}$ is greater than $X_{20}$, where X represents reactance and the subscript thereof represents the component in FIG. 1 whose reactance is being represented.

Since inductive reactance is directly proportional to frequency and capacitive reactance is inversely proportional to frequency, at lower overtones, the inductive reactance of the inductor 18 will decrease and the capacitive reactance of a capacitor 20 will increase, thereby resulting in a net capacitive reactance for the combination of the capacitor 20 and the inductor 18. Since an inductive series arm is necessary in the feedback circuit of a Colpitts oscillator, the capacitive reactance of the combination of inductor 18 and capacitor 20 will make oscillation impossible at lower overtones of the crystal 22. At higher overtones, the shunt capacitors in the circuit, such as capacitors 16, 34, 36 and 30 increase the attenuation of the feedback circuit, thereby preventing oscillation at the higher overtones.

Figure 2:
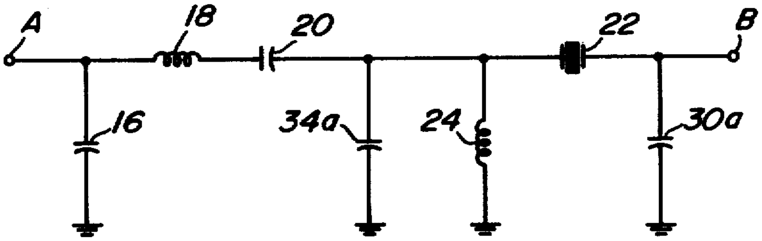
FIG. 2 shows the equivalent circuit of the feedback portion of the oscillataor of FIG. 1 which may be used if transformer neutralization is not desired.

Referring to FIG. 2, there is shown an equivalent circuit of the circuitry between points or first and second terminals A and B of FIG. 1. The capacitors 16, 20, inductor 18 and crystal 22 are similar to the respectively numbered components in FIG. 1. Capacitor 34a represents the shunt capacitance 34, capacitor 30a represents the capacitance of the shunt capactors 30 and 36, and inductor $L_{24}$ represents the inductance of the winding 24 of FIG. 1.

The equivalent circuit shown in FIG. 2 is included to illustrate the operation of the circuit of FIG. 1, however, in the event that transformer neutralization is not desired, a circuit similar to that shown in FIG. 2 may be employed. In the circuit of FIG. 2, at the desired operating frequency, the crystal 22 is substantially resistive, the combination of capacitor **34*a* and inductor $L_{24}$ is a parallel resonance, and the series combination of inductor 18 and capacitor 20 provides a net inductive reactance, thereby providing a 180° phase shift between points A and B. At overtones lower than the desired operating frequency, the net reactance of inductor 18 and capactor 20 is capacitive, and the combination of capacitor 34a** and inductor $L_{24}$ is inductive, thereby changing the phase shift between points A and B to a value other than 180° to make oscillation impossible.

At frequencies above the desired operating frequency, the combination of capacitor **34*a* and $L_{24}$ is capacitive. The resulting capacitive reactance together with the capacitance of the capacitors 16 and 30*a*** provides a low impedance path to ground, or third terminal, which increases the attenuation between points A and B to prevent oscillation.

Whereas a particular embodiment of the invention has been shown, and variations thereof, such as, among others, the grounding of different points of the oscillator, it should be noted that any circuit employing the basic concepts of the embodiment described in the foregoing falls within the scope and spirit of the invention.

We claim:

1. A crystal controlled overtone oscillator comprising:

an amplifier having first, second and third terminals;

a point of reference potential connected to said third terminal;

a piezoelectric crystal having a predetermined overtone operating frequency and other resonant frequencies;

an inductor and a capacitor conncted in a series circuit with said crystal, said series circuit being connected in series between the first and second terminals of said amplifier, said inductor and capacitor having values chosen such that the inductive reactance of said inductor is greater than the capacitive reactance of said inductor is greater than the capacitive reactance of said capacitor at said predetermined overtone operating frequency, said inductor and capacitor further arranged to form the inductive tuning element of a Colpitts oscillator, and the inductive reactance of said inductor is less than the capacitive reactance of said capacitor at resonant frequencies of said crystal lower than said predetermined overtone operating frequency; and parallel connected inductance-capacitance means connected betweeen a terminal of said crystal and the point of reference potential, said inductance-capacitance means being parallel resonant at said predetermined overtone operating frequency.

2. A crystal controlled overtone oscillator as recited in claim 1, wherein said amplifier circuit further includes capacitor means connected between the second and third terminals of said amplifier circuits.

3. An oscillator circuit as recited in claim 2 wherein said amplifier circuit includes means for providing a 180° phase shift between the first and second terminals thereof.

4. An oscillator circuit as recited in claim 3 wherein said crystals has a predetermined static shunt capacitance in parallel therewith, and wherein said oscillator circuit includes a neutralizing circuit having first, second and third terminals; means connecting said first terminal to a first terminal of said crystal, further means connecting said second terminal to a second terminal of said crystal, means connecting said third terminal to said point of reference potential and a predetermined inductive reactance substantially equal to one half the capacitive reactance of said static shunt capacitance between the first and third terminals thereof at said predetermined overtone operating frequency.

5. An oscillator circuit as recited in claim 4 wherein said neutralizing circuit includes transformer means having primary and secondary winding means, the self inductance of said primary winding means being selected such that the inductive reactance thereof at said predetermined overtone operating frequency is substantially equal to one half the capacitive reactance of said static shunt capacitance.

6. An oscillator circuit as recited in claim 4 wherein the difference between the inductive reactance of said inductor and the capacitive reactance of said capacitor at said predetermined overtone operating frequency is approximately equal to the sum of the capacitive reactance of said capacitor means plus one half the capacitive reactance of said static shunt capacitance.

7. An oscillator circuit as recited in claim 6 further including second capacitor means connected between the first and third terminals of said amplifier circuit.

8. An oscillator circuit as recited in claim 7 wherein said amplifier circuit includes a transistor having base, collector and emitter electrodes coupled to said first, second and third terminals, respectively, of said amplifier circuit.

* * * * *